(12) United States Patent
Maruyama

(10) Patent No.: US 6,473,699 B2
(45) Date of Patent: *Oct. 29, 2002

(54) POWER ARITHMETIC APPARATUS

(75) Inventor: Ryoji Maruyama, Kawasaki (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/263,935

(22) Filed: Mar. 8, 1999

(65) Prior Publication Data
US 2002/0013668 A1 Jan. 31, 2002

(30) Foreign Application Priority Data
Mar. 10, 1998 (JP) .............................. 10-058075

(51) Int. Cl.[7] .............................................. G01R 21/00
(52) U.S. Cl. ........................ 702/60; 702/64; 324/142; 361/79
(58) Field of Search .............................. 702/57, 60, 61, 702/62, 64, 65; 324/76.11, 76.16, 76.17, 141, 142; 361/79, 86–87

(56) References Cited

U.S. PATENT DOCUMENTS

| | | | | | |
|---|---|---|---|---|---|
| 4,255,707 A | * | 3/1981 | Miller | ........................ | 324/142 |
| 5,099,195 A | * | 3/1992 | Greer et al. | ................. | 324/142 |
| 5,170,115 A | | 12/1992 | Kashiwabara et al. | | |
| 5,243,276 A | | 9/1993 | Kashiwabara et al. | | |
| 5,369,356 A | | 11/1994 | Kinney et al. | | |
| 5,448,747 A | * | 9/1995 | Garverick et al. | ............. | 702/64 |
| 5,924,050 A | * | 7/1999 | Maruyama | .................... | 702/60 |
| 6,097,192 A | * | 8/2000 | Obermeier et al. | ......... | 324/424 |

FOREIGN PATENT DOCUMENTS

| | | |
|---|---|---|
| EP | 0 772 052 | 5/1997 |
| JP | 9-292417 | 11/1997 |
| WO | WO 94/22024 | 9/1994 |

\* cited by examiner

*Primary Examiner*—Bryan Bui
(74) *Attorney, Agent, or Firm*—Finnegan, Henderson, Farabow, Garrett & Dunner, L.L.P.

(57) ABSTRACT

Power arithmetic apparatus detects a first variation amount of a voltage in proportion to a voltage of a measuring object and a second variation amount of a voltage in proportion to a current of the measuring object, and calculates power of the measuring object based on the first variation amount detected and the second variation amount detected.

17 Claims, 3 Drawing Sheets

POWER ARITHMETIC APPARATUS

BACKGROUND OF THE INVENTION

The present invention relates to a power arithmetic apparatus for calculating power from an AC current and voltage of a target measurement system.

FIG. 1 is a block diagram showing a conventional power arithmetic apparatus.

Referring to FIG. 1, terminals T1 and T2 input a voltage V1 and a current A1 in proportion to the voltage and current of a target measurement system. The voltages V1 and A1 are converted into digital values by A/D converters 1 and 2, respectively. A CPU 3 calculates the digital values from the A/D converters 1 and 2 at a predetermined time interval.

The power arithmetic apparatus of this scheme serves as a wattmeter by calculating $$P = V1 \cdot A1$$

and performing integration for a predetermined time, or as a watthour meter by performing infinite time integration.

However, such power arithmetic apparatus has the following problems.

(1) Since the voltage V1 and current A1 are multiplied by software, multiplication instruction processing takes a time.

(2) Since calculation is performed by software, processing is complex and time-consuming, so another processing can hardly be performed by software.

(3) Conversion using A/D converters takes a time, so the sampling frequency can hardly be increased. To increase the accuracy, the number of bits is increased, although this results in an increase in cost.

BRIEF SUMMARY OF THE INVENTION

The present invention has been made in consideration of the above situation, and has as its object to provide a power arithmetic apparatus capable of performing multiplication instruction processing in a short time, avoiding complex processing to allow software to perform another processing, and preventing an increase in cost even when the sampling frequency is increased.

To achieve the above object, according to a first aspect of the present invention, there is provided a power arithmetic apparatus comprising:

means for detecting a first variation amount in a voltage in proportion to a voltage of a measuring object and a second variation amount in a voltage in proportion to a current of the measuring object; and means for calculating power of the measuring object based on the first variation amount detected and the second variation amount detected.

According to a second aspect of the present innovation, there is provided a apparatus according to first aspect, wherein the means for detecting the first variation amount and second variation amount comprises:

a first A/D converter for converting the voltage in proportion to the voltage of the measuring object to a first digital signal indicating the voltage in proportion to the voltage of the measuring object;

a second converter for converting the voltage in proportion to the current of the measuring object to a second digital signal indicating the voltage in proportion to the current of the measuring object;

a first counter for outputting the first variation amount based on the first digital signal; and a second counter for outputting the second variation amount based on the second digital signal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described below with reference to the accompanying drawing.

Figure 1:
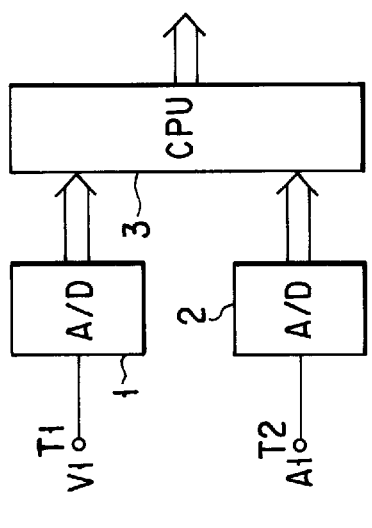
FIG. 1 is a block diagram showing a conventional power arithmetic apparatus.
Figure 2:
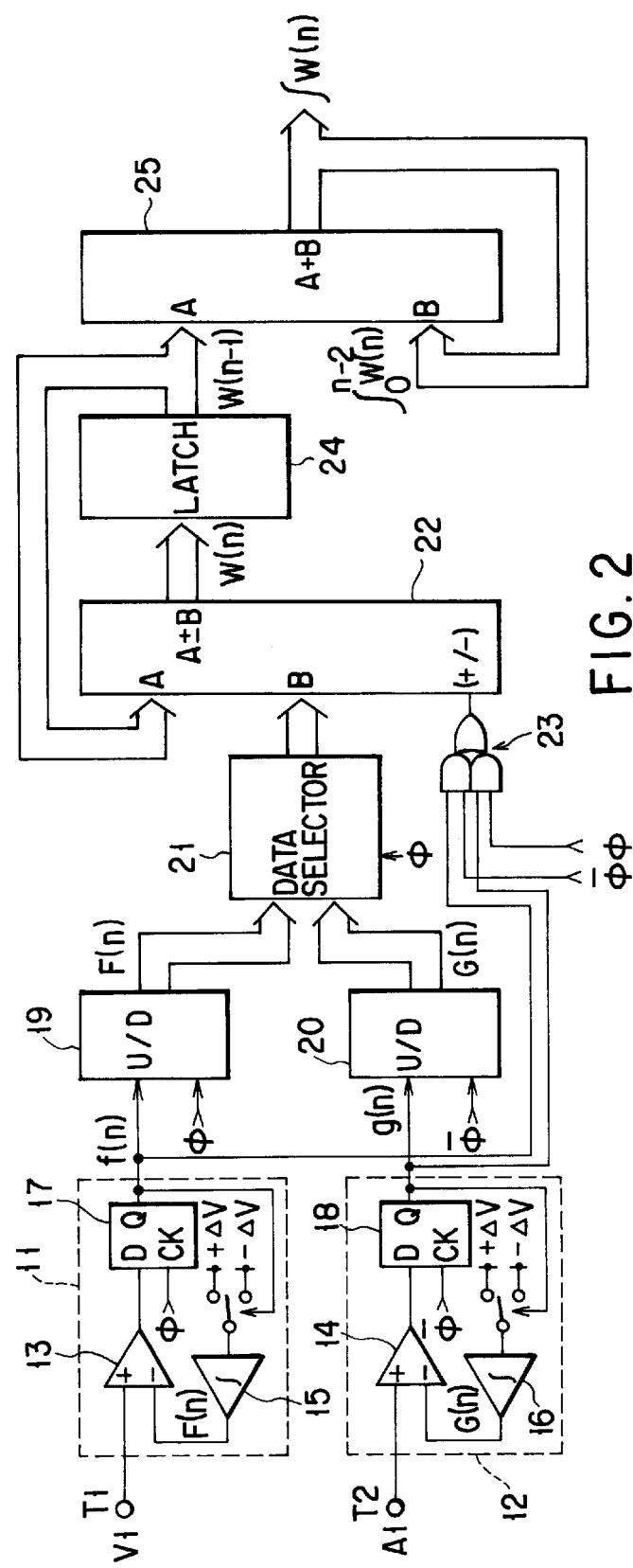
FIG. 2 is a block diagram showing a power arithmetic apparatus according to the first embodiment of the present invention.

FIG. 2 is a block diagram showing a power arithmetic apparatus according to the first embodiment of the present invention.

Referring to FIG. 2, terminals T1 and T2 are input terminals for inputting voltages V1 and A1 in proportion to the voltage and current of a target measurement system. The outputs from the input terminals T1 and T2 are input to positive input terminals of comparators 13 and 14 in 1-bit A/D converters 11 and 12 called delta modulators, respectively. The output from integrators 15 and 16 are supplied to the negative input terminals of the comparators 13 and 14, respectively. The outputs from the comparators 13 and 14 are supplied to the D input terminals of flip-flops 17 and 18, respectively.

The A/D converters 11 and 12 encode the above voltages V1 and A1 and output 1-bit pulse signals f(n) and g(n), respectively. The timing is determined by a clock $\phi$ in the A/D converter 11 and by a clock obtained by inverting the clock $\phi$ in the A/D converter 12.

At the rise of the clock, output voltage F(n) or G(n) from the integrator 15 or 16 and the magnitude of the input voltage V1 or A1 are compared by the comparator 13 or 14. When V1>F(n), or A1>G(n), a signal of high level (H) is output from the A/D converter 11 or 12, and the integrator 15 or 16 integrates the signal by only $+\Delta v$. When V1<F(n), or A1<G(n), a signal of low level (L) is output, and the integrator integrates the signal by only $-\Delta v$.

The outputs from the A/D converters 11 and 12 are output to up-down counters 19 and 20, respectively, to control the up-down counting operation. The clocks $\phi$ or clocks obtained by inverting the clocks $\phi$ are counted. The outputs F(n) and G(n) from the up-down counters 19 and 20 correspond to values obtained by A/D-converting the input voltages V1 and A1, respectively.

A data selector 21 selects one of the values from the up-down counters 19 and 20, which is to be supplied to an adder/subtracter 22. When the clock φ is at "H" level, the data selector 21 selects data on the up-down counter 19 side. When the clock φ is at "L" level, data on the up-down counter 20 side is selected.

The output from the data selector 21 and the output from a latch 24 are supplied to the adder/subtracter 22. At the same time, the output from a gate portion 23 comprising an AND gate and an OR gate which receive the output voltages f(n) and g(n) from the A/D converters 11 and 12 and the clock φ and an inverted clock of the clock φ are supplied to the adder/subtracter 22.

The adder/subtracter 22 sequentially performs addition or subtraction of digital values from two input terminals A and B, i.e., an output value W(n−1) from the latch 24 and the output value F(n) from the up-down counter 19 or the output value G(n) from the up-down counter 20. For the input terminal B, addition or subtraction is determined on the basis of the signal input to the (+/−) terminal.

The output from the A/D converter 11 or 12 is input to the (+/−) terminal. When the clock φ is at "H" level, the output from the A/D converter 12 is selected. When the clock φ is at "L" level, the output from the A/D converter 11 is selected. When the (+/−) terminal is at "H" level, addition is performed. When the (+/−) terminal is at "L" level, subtraction is performed. The output from the adder/subtracter 22 has a value in proportion to instantaneous V1×A1.

The latch 24 latches W(n−1) immediately preceeding an output W(n) from the adder/subtracter 22. Hence, the latch 24 outputs the value W(n−1).

The output W(n−1) from the latch 24 is supplied to an adder 25. The adder 25 calculates a sum ∫W(n) before the adder 25 itself. Consequently, the integrated value ∫W(n) of the multiplied values of the instantaneous voltages V1 and A1 can be obtained.

Figure 3:
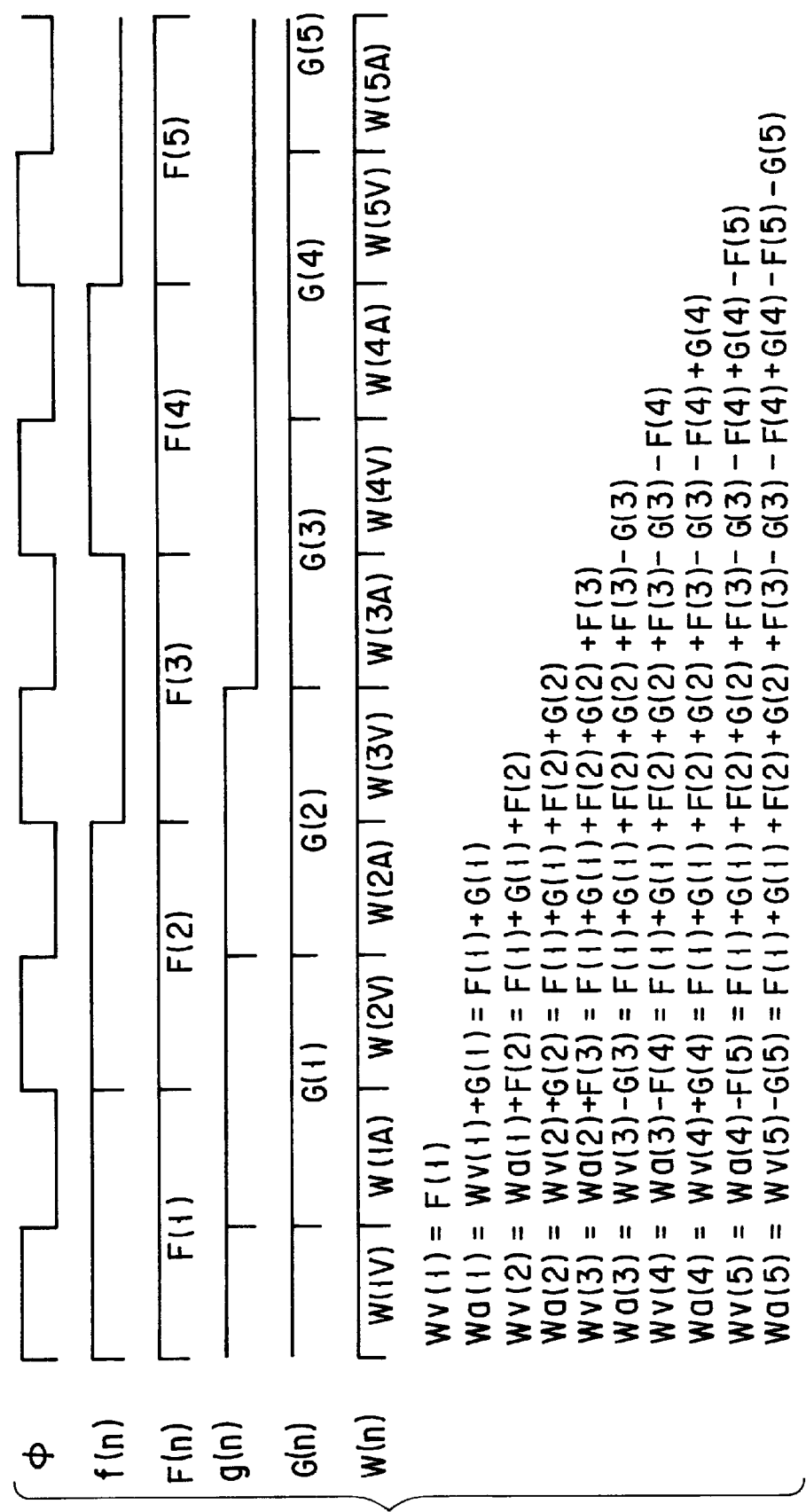
FIG. 3 is a timing chart for explaining the operation of the power arithmetic apparatus shown in FIG. 2.

The operation of the power arithmetic apparatus having the above arrangement will be described with reference to the timing chart in FIG. 3 showing the waveforms at the respective portions.

The voltages V1 and A1 are proportional to the voltage and current of the target measurement system. The outputs from the A/D converters 11 and 12 are represented by the pulse sequences f(n) and g(n) in FIG. 3, respectively. The pulse signal f(n) operates at the rise of the clock φ, and the pulse signal g(n) operates at the inverted clock of the clock φ. These pulse signals have a value "+1" or "−1".

The signals F(n) and G(n) are obtained by integrating the outputs from the A/D converters 11 and 12, respectively. When the signal F(n) is output, the clock φ is counted, and when the signal G(n) is output, the inverted clock of the clock φ is counted. The value F(n) equals a value obtained by A/D-converting the voltage V1, and the value G(n) equals a value obtained by A/D-converting the current A1.

The object of the present invention is to obtain V1×A1. In this case, V1 and F(n), and A1 and G(n) have the following relations:

$$V1 \approx F(n) \quad (1)$$

$$A1 \approx G(n) \quad (2)$$

Hence, F(n)×G(n)=W(n) is defined.

When the output from the A/D converter 11 is represented by f(1), f(2), ..., f(n), the output signal F(n) from the integrator 15 at that time is $$F(n) = (f(1) + f(2) + \ldots f(n)) \times \Delta v \quad (3)$$

The output signal from the up-down counter 19 equals the digital code value of F(n).

Similarly, the output signal G(n) is $$G(n) = (g(1) + g(2) + \ldots g(n)) \times \Delta v \quad (4)$$

The value F(n)×G(n)=W(n) to be obtained is given by $$W(n) = F(n) \times G(n) \quad (5)$$
$$= (f(1) + f(2) + \ldots + f(n)) \times (g(1) + g(2) + \ldots + g(n))$$

Since the value F(n) is determined at the rise timing of the clock φ, and the value G(n) is determined at the rise timing of the inverted clock of the clock φ, i.e., at the fall timing of the clock φ, the value W(n) is obtained in two steps.

Let Wv(n) be the timing at which the count F(n) on the voltage side is determined, and Wa(n) be the timing at which the count G(n) on the current side is determined. At the timing Wv(n) at which the count F(n) on the voltage side is determined, rewriting equation (5) yields:

$$Wv(n) = F(n) \times G(n)$$
$$= (f(1) + f(2) + \ldots + f(n)) \times (g(1) + g(2) + \ldots + g(n))$$
$$= F(n) \times (G(n-1) + g(n))$$
since $g(n) = \pm 1$,
$$Wv(n) = F(n) \times G(n-1) \pm F(n)$$
$$= Wa(n-1) \pm F(n)$$

At the timing Wa(n) at which the count G(n) on the current side is determined, rewriting equation (5) yields:

$$Wa(n) = F(n) \times G(n)$$
$$= (f(1) + f(2) + \ldots + f(n)) \times (g(1) + g(2) + \ldots + g(n))$$
$$= (F(n-1) + f(n)) \times G(n)$$
since $f(n) = \pm 1$,
$$Wa(n) = F(n) \times G(n) \pm G(n)$$
$$= Wv(n) \pm G(n)$$

Hence, at the timing at which the count F(n) on the voltage side is determined, the adder/subtracter 22 determines the value to be added/subtracted to/from the value held by the latch 24 on the basis of the output from the A/D converter 12 on the current side. When the output data F(n) from the voltage-side up-down counter 19 is added/subtracted, the instantaneous V1×A1, i.e., W(n) can be obtained as the output from the adder/subtracter 22.

At the timing at which the count G(n) on the current side is determined, the adder/subtracter 22 determines the value to be added/subtracted to/from the value held by the latch 24 on the basis of the output from the A/D converter 11 on the voltage side. When the output data G(n) from the current-side up-down counter 20 is added/subtracted, the instantaneous V1×A1, i.e., W(n) can be obtained as the output from the adder/subtracter 22.

Practically, the value W(n) is further integrated by the adder 25 and used power or electric energy data.

The second embodiment of the present invention will be described next.

In a delta modulator used as an A/D converter, a small difference is sometimes generated in the integration width of Δv between the upper and lower rows because of the influence of performance of an integrator in the modulator. For this reason, when the modulator is operated for a long time, the "0" point of the up-down counter may be shifted from the original "0" point.

Figure 4:
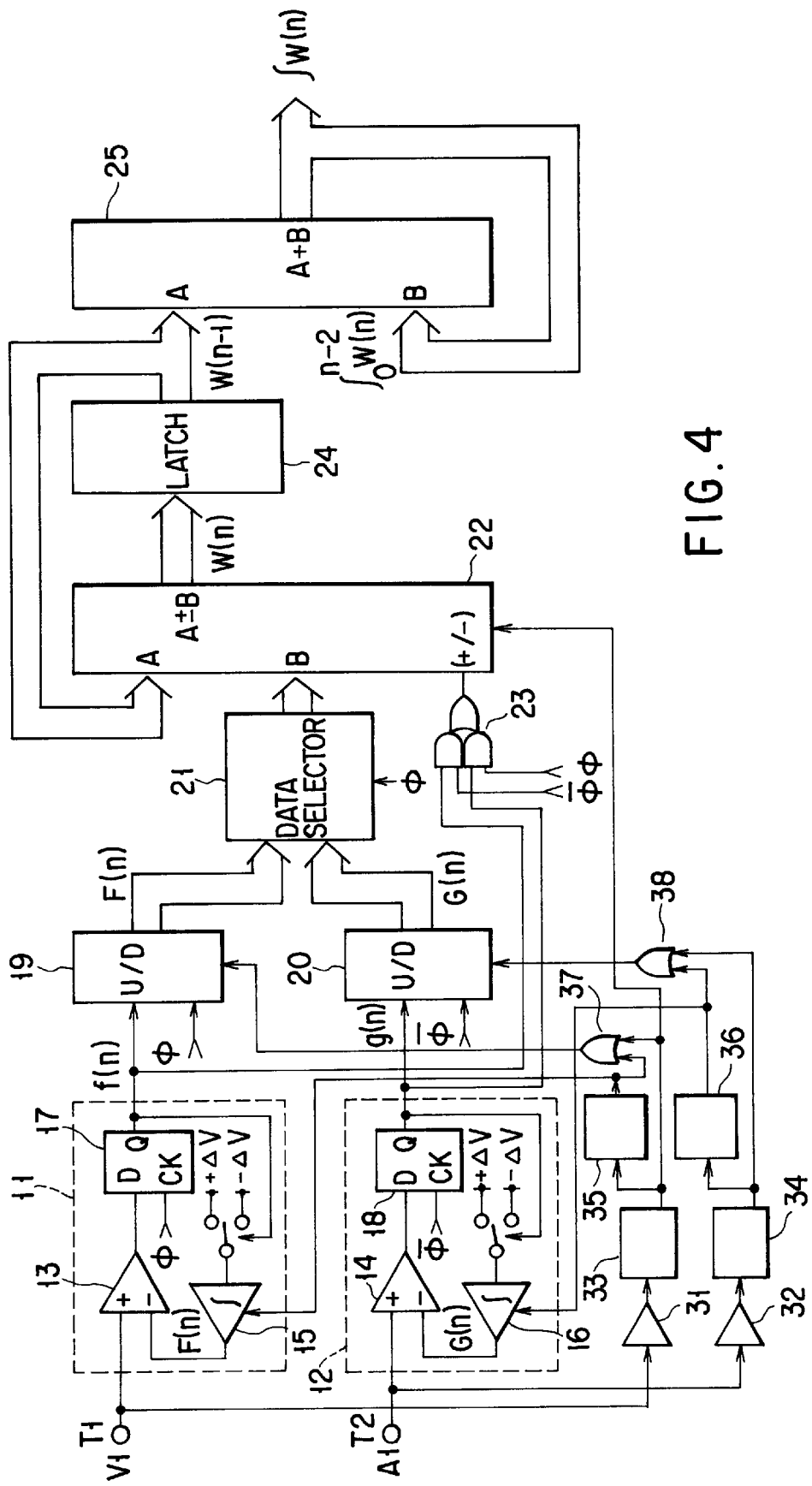
FIG. 4 is a block diagram showing a power arithmetic apparatus according to the second embodiment of the present invention.

FIG. 4 is a block diagram showing the arrangement of a power arithmetic apparatus according to the second embodiment for improving the point shift. The same reference numerals as in the first embodiment shown in FIG. 2 denote the same parts in FIG. 4, and a detailed description thereof will be omitted.

Comparators 31 and 32 are connected to terminals T1 and T2, respectively, to detect a timing at which input AC voltages V1 and A1 become zero. Every time the comparators 31 and 32 detect the timing at which the voltages V1 and A1 become zero, one-shot circuits 33 and 34 generate one-shot signals to clear up-down counters 19 and 20 and adder/subtracter 22 (cleared when only the voltage V1 becomes zero in this embodiment).

The outputs from the one-shot circuits 33 and 34 are supplied to timing circuits 35 and 36, respectively. The outputs from the timing circuits 35 and 36 are supplied to integrators 15 and 16 in A/D converters 11 and 12 and also to the up-down counters 19 and 20 through OR gates 37 and 38, respectively.

When the voltages V1 and A1 do not become zero for a long time, e.g., when the voltages do not become zero for 1 sec, the timing circuits 35 and 36 generate one-shot signals to clear the integrators 15 and 16 in the A/D converters 11 and 12 and the up-down counters 19 and 20, respectively.

According to the second embodiment, the up-down counters 19 and 20 and the integrators 15 and 16 in the A/D converters 11 and 12 are simultaneously cleared every predetermined period. Hence, the "0" point shift which disables accurate measurement can be prevented.

As the above-described A/D converter, a delta sigma modulator may be used in place of the delta modulator.

According to this embodiment, the power arithmetic apparatus comprises two 1-bit A/D converters for converting voltages in proportion to the voltage and current of a target measurement system into 1-bit codes, two up-down counters whose up-down counting is controlled by the 1-bit codes output from the two 1-bit A/D converters, an addition/subtraction circuit for adding/subtracting output data from the up-down counters to/from previous output data, and a latch for sampling the previous data from the addition/subtraction circuit and outputting the data to the addition/subtraction circuit. The addition/subtraction circuit selectively performs addition or subtraction on the basis of the output data from the two 1-bit A/D converters.

With this arrangement, the sampling rate can be increased, and the resolving power (the number of bits) in coding an analog signal can be reduced. A compact and inexpensive power arithmetic apparatus can be provided. By minimizing processing by the CPU using software, processing by software can be simplified. A power arithmetic apparatus, wattmeter, or watthour meter can be constructed without using any software. A circuit arrangement suitable as an LSI can be obtained.

As has been described above, according to the present invention, the analog portion comprises only A/D converters and has a very small number of components. For this reason, a compact LSI can be realized at low cost. In addition, a wattmeter or watthour meter can be constructed using only hardware. Furthermore, since the sampling rate can be increased, the accuracy can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power arithmetic apparatus comprising:
    means for detecting a first variation amount in a voltage in proportion to a voltage of a measuring object and a second variation amount in a voltage in proportion to a current of the measuring object; and
    means for calculating power of the measuring object based on the first variation amount detected and the second variation amount detected;
    wherein the means for detecting the first variation amount and second variation amount comprises:
    a first converter for converting the voltage in proportion to the voltage of the measuring object to a first digital signal indicating the voltage in proportion to the voltage of the measuring object;
    a second converter for converting the voltage in proportion to the current of the measuring object to a second digital signal indicating the voltage in proportion to the current of the measuring object;
    a first counter for outputting the first variation amount based on the first digital signal; and
    a second counter for outputting the second variation amount based on the second digital signal.

2. The apparatus according to claim 1, wherein the first counter is cleared at a predetermined timing.

3. The apparatus according to claim 2,
    wherein the predetermined timing is in synchronization with a timing at which the voltage in proportion to the voltage of the measuring object becomes zero.

4. The apparatus according to claim 3, further comprising means for clearing the first counter when the timing at which the voltage in proportion to the voltage of the measuring object becomes zero is not detected in a predetermined time.

5. The apparatus according to claim 1, wherein the second counter is cleared at a predetermined timing.

6. The apparatus according to claim 5,
    wherein the predetermined timing is in synchronization with a timing at which the voltage in proportion to the current of the measuring object becomes zero.

7. The apparatus according to claim 6, further comprising means for clearing the second counter when the timing at which the voltage in proportion to the current of the measuring object becomes zero is not detected in a predetermined time.

8. The apparatus according to claim 1, wherein the first converter comprises an integrator, being cleared at a predetermined timing, for outputting a reference voltage.

9. The apparatus according to claim 8,
wherein the predetermined timing is in synchronization with a timing at which the voltage in proportion to the voltage of the measuring object becomes zero.

10. The apparatus according to claim 9, further comprising means for clearing the integrator when the timing at which the voltage in proportion to the voltage of the measuring object becomes zero is not detected in a predetermined time.

11. The apparatus according to claim 1, wherein the second converter comprises an integrator, being cleared at a predetermined timing, for outputting a reference voltage.

12. The apparatus according to claim 11,
wherein the predetermined timing is in synchronization with a timing at which the voltage in proportion to the current of the measuring object becomes zero.

13. The apparatus according to claim 12, further comprising means for clearing the integrator when the timing at which the voltage in proportion to the voltage of the measuring object becomes zero is not detected in a predetermined time.

14. A power arithmetic apparatus comprising:
means for detecting a first variation amount in a voltage in proportion to a voltage of a measuring object and a second variation amount in a voltage in proportion to a current of the measuring object;
means for calculating power of the measuring object based on the first variation amount detected and the second variation amount detected;
a selector for alternately outputting the first variation amount detected and the second variation amount detected in synchronization with a clock signal;
wherein the means for detecting the first variation amount and second variation amount comprises:
a first converter for converting the voltage in proportion to the voltage of the measuring object to a first digital signal indicating the voltage in proportion to the voltage of the measuring object;
a second converter for converting the voltage in proportion to the current of the measuring object to a second digital signal indicating the voltage in proportion to the current of the measuring object;
a first counter for outputting the first variation amount based on the first digital signal; and
a second counter for outputting the second variation amount based on the second digital signal; and
data selecting means for alternately selecting outputs from the first and second counters;
addition/subtraction means for performing addition/subtraction between last output data from the addition/subtraction means and output data from the data selecting means; and
switching means for switching the addition/subtraction means between addition and subtraction in accordance with the first and second digital signals output from the first and second converters.

15. A power arithmetic apparatus comprising:
means for detecting a first variation amount in a voltage in proportion to a voltage of a measuring object and a second variation amount in a voltage in proportion to a current of the measuring object;
means for calculating power of the measuring object based on the first variation amount detected and the second variation amount detected;
wherein the means for calculating power of the measuring object is cleared at a predetermined timing;
wherein the means for detecting the first variation amount and second variation amount comprises:
a first converter for converting the voltage in proportion to the voltage of the measuring object to a first digital signal indicating the voltage in proportion to the voltage of the measuring object;
a second converter for converting the voltage in proportion to the current of the measuring object to a second digital signal indicating the voltage in proportion to the current of the measuring object;
a first counter for outputting the first variation amount based on the first digital signal; and
a second counter for outputting the second variation amount based on the second digital signal; and
data selecting means for alternately selecting outputs from the first and second counters;
addition/subtraction means for performing addition/subtraction between last output data from the addition/subtraction means and output data from the data selecting means; and
switching means for switching the addition/subtraction means between addition and subtraction in accordance with the first and second digital signals output from the first and second converters.

16. The apparatus according to claim 15,
wherein the predetermined timing is in synchronization with a timing at which the voltage in proportion to the voltage of the measuring object becomes zero.

17. The apparatus according to claim 16, further comprising means for clearing the means for calculating power of the measuring object when the timing at which the voltage in proportion to the voltage of the measuring object becomes zero is not detected in a predetermined time.

* * * * *

UNITED STATES PATENT AND TRADEMARK OFFICE
CERTIFICATE OF CORRECTION

PATENT NO.    : 6,473,699 B2
DATED         : October 29, 2002
INVENTOR(S)   : Maruyama It is certified that error appears in the above-identified patent and that said Letters Patent is hereby corrected as shown below:

Column 6,
Line 26, after "object;", delete "and".
Line 43, "amount based on the second digital signal." should read -- amount based on the second digital signal; and data selecting means for alternatively selecting outputs from the first and second counters;

addition/subtraction means for performing addition/subtraction between last output data from the addition/subtraction means and output data from the data selecting means; and switching means for switching the addition/subtraction means between addition and subtraction in accordance with the first and second digital signals output from the first and second converters.--.

Column 8,
Line 51, insert missing claim 18:

--18.  A power arithmetic apparatus comprising:

two 1-bit A/D conversion sections which convert a voltage into 1-bit codes, the voltage being directly proportional to a voltage or current in a system under measurement;

two up-down counters whose operations are controlled by the 1-bit codes output from the two 1-bit A/D conversion sections;

a data selecting section which alternatively selects outputs from the up-down counters;

an addition/subtraction section which executes addition or subtraction with respect to output data produced from the data selecting section and output data produced from the data selecting section last time; and a switching section which switches the addition/subtraction section between addition processing and subtraction processing on the basis of the output data from the two 1-bit A/D conversion section.--.

Signed and Sealed this

Twenty-second Day of July, 2003

JAMES E. ROGAN
*Director of the United States Patent and Trademark Office*